United States Patent
Niedernostheide et al.

(10) Patent No.: US 7,649,244 B2
(45) Date of Patent: Jan. 19, 2010

(54) VERTICAL SEMICONDUCTOR DEVICE HAVING SEMICONDUCTOR ZONES FOR IMPROVED OPERABILITY UNDER DYNAMIC PROCESSES

(75) Inventors: Franz Josef Niedernostheide, Muenster (DE); Hans-Joachim Schulze, Ottobrunn (DE)

(73) Assignee: Infineon Technologies Austria AG, Villach (AT)

( * ) Notice: Subject to any disclaimer, the term of this patent is extended or adjusted under 35 U.S.C. 154(b) by 79 days.

(21) Appl. No.: 11/546,010

(22) Filed: Oct. 11, 2006

(65) Prior Publication Data

US 2007/0120170 A1    May 31, 2007

(30) Foreign Application Priority Data

Oct. 13, 2005    (DE) ................ 10 2005 049 506

(51) Int. Cl.
*H01L 29/74* (2006.01)
(52) U.S. Cl. ................ 257/655; 257/656; 257/657
(58) Field of Classification Search .......... 257/656–657
See application file for complete search history.

(56) References Cited

U.S. PATENT DOCUMENTS

| 4,268,846 A | 5/1981 | Spellman et al. |
| 4,972,239 A | 11/1990 | Mihara |
| 5,031,009 A | 7/1991 | Fujihira |
| 6,008,520 A | 12/1999 | Darwish et al. |
| 2002/0130331 A1* | 9/2002 | Nemoto et al. ............. 257/109 |
| 2006/0081923 A1 | 4/2006 | Mauder et al. |

FOREIGN PATENT DOCUMENTS

| DE | 102004047749 | 4/2006 |
| EP | 509215 A1 * | 10/1992 |

* cited by examiner

*Primary Examiner*—David Vu
*Assistant Examiner*—Arman Khosraviani
(74) *Attorney, Agent, or Firm*—Maginot, Moore & Beck

(57) ABSTRACT

A vertical semiconductor device comprises a semiconductor body, a first contact and a second contact, wherein a first semiconductor region of a first conductivity type, a second semiconductor region of a second conductivity type and a third semiconductor region of a second conductivity type are formed in the semiconductor body in a direction from the first contact to the second contact, wherein a basic doping density of the second semiconductor region is smaller than a doping density of the third semiconductor region, and wherein in the second semiconductor region a semiconductor zone of the second conductivity type is arranged in which the doping density is increased relative to the basic doping density of the second semiconductor region.

23 Claims, 5 Drawing Sheets

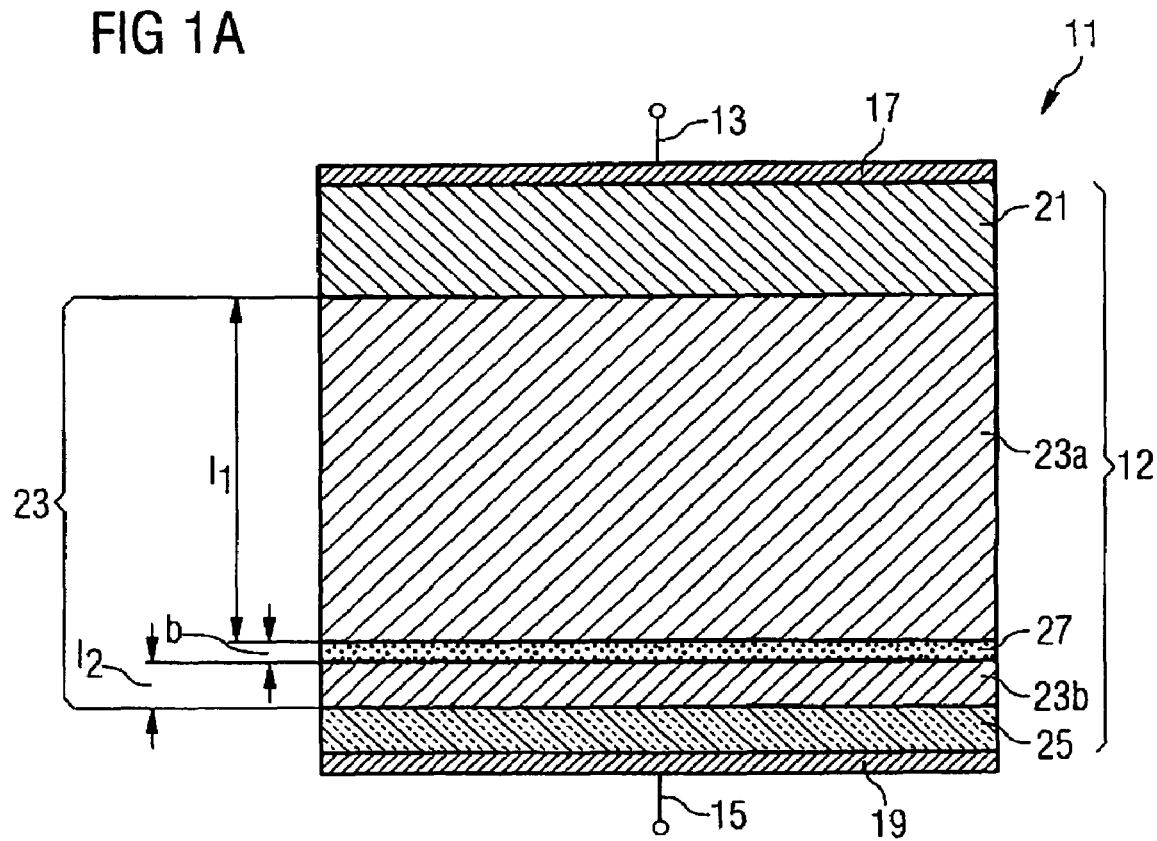

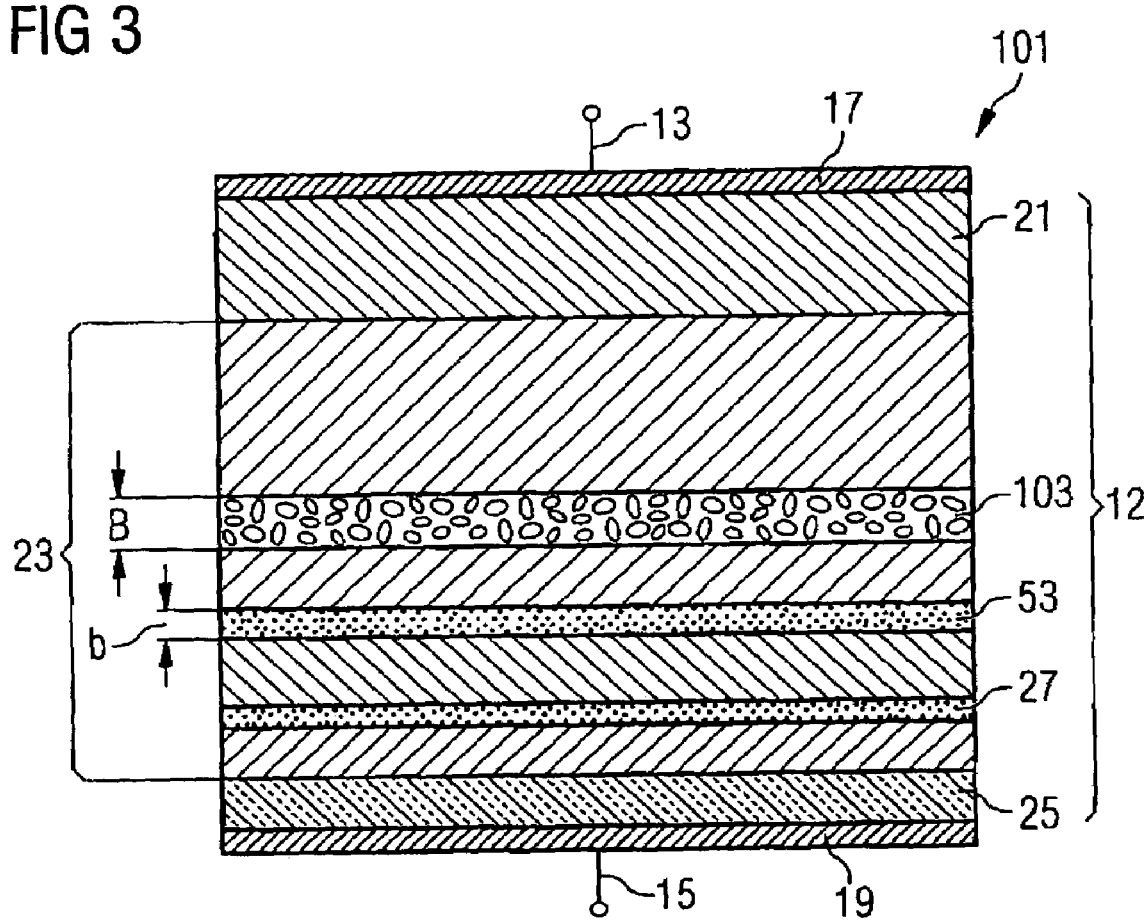

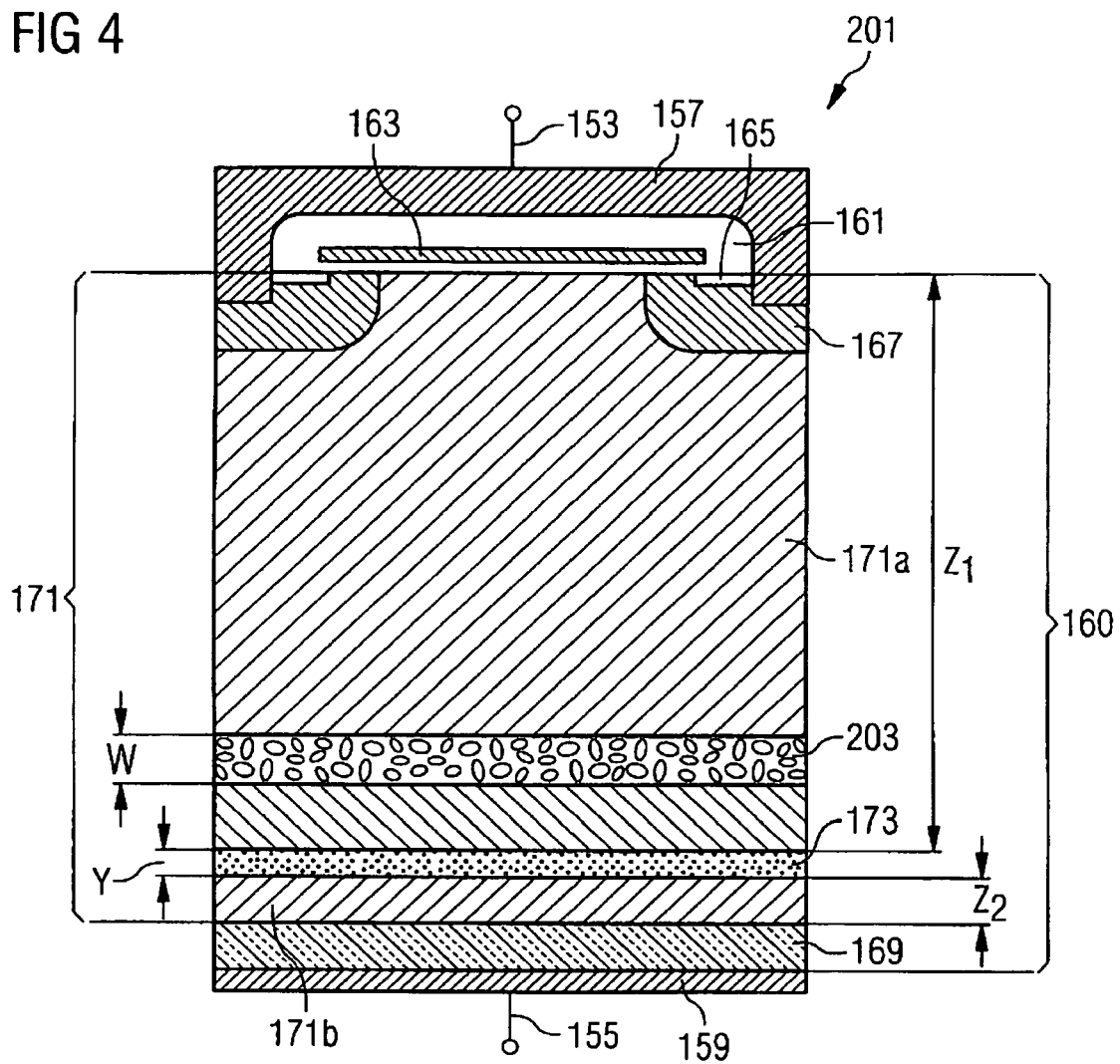

VERTICAL SEMICONDUCTOR DEVICE HAVING SEMICONDUCTOR ZONES FOR IMPROVED OPERABILITY UNDER DYNAMIC PROCESSES

CROSS-REFERENCE TO RELATED APPLICATION

This application claims priority from German Patent Application No. 102005049506.0, which was filed on Oct. 13, 2005, and is incorporated herein by reference in its entirety.

FIELD

The present invention relates to a vertical semiconductor device, such as, for example, a diode, an IGBT or an MOSFET.

BACKGROUND

Vertical power semiconductor devices are increasingly used for switching high currents through loads, such as, for example, electric motors. Due to dynamic processes, such as, for example, overcurrent shutdown or short circuit loading, the result can be excessive field increases or too high an electric field in the power semiconductor device. Excessive field increases may result in large-area or filament-like or thread-like excessive current increases. When down-commuting the charge carriers from the space-charge region, for example, such an excessive field increase at or on the backside of the power semiconductor will result at the end of this process.

A probability of destroying the device here is the higher, the lower the basic doping of the starting material. With a low basic doping of the starting material, only a low fixed space charge is available so that in dynamic processes, such as, for example, short circuit loading, down-commuting or overcurrent shut down, there is an increased probability of overcompensation of this space charge, which influences the distribution of the electric field in the power semiconductor negatively and may thus result in the device to be destroyed.

SUMMARY OF THE INVENTION

A vertical semiconductor device having improved electrical characteristics is disclosed herein.

In accordance with an embodiment of the present invention, a vertical semiconductor device is provided having: a semi-conductor body; a first contact on a first side of the semiconductor body; a second contact on a second side of the semiconductor body opposite the first side; wherein in the semiconductor body, in a direction from the first con-tact to the second contact, in the order mentioned, a first semiconductor region of a first conductivity type; a second semiconductor region of a second conductivity type; and a third semiconductor region of a second conductivity type are formed; wherein a basic doping density of the second semiconductor region is lower than a doping density of the third semiconductor region and the third semiconductor region is connected to the second contact in an electrically conductive manner; wherein in the second semiconductor region a semiconductor zone of the second conductivity type in which the doping density is increased relative to the basic doping density of the second semiconductor region is arranged such that it separates a first part of the second semiconductor region of the basic doping density arranged closer to the first semiconductor region from a second part of the second semiconductor region of the basic doping density arranged closer to the third semiconductor region; and wherein a maximum value of the doping density in the semi-conductor zone is in a range of greater than $10^{16}$ cm$^{-3}$ and a thickness of the semiconductor zone along the direction from the first contact to the second contact is in a range of smaller than 3 μm.

In accordance with another embodiment of the present invention, a vertical semiconductor device is provided having; a semiconductor body; a first contact on a first side of the semi-conductor body; a second contact on a second side of the semiconductor body opposite the first side; wherein in the semiconductor body, in a direction from the first contact to the second contact, in the order mentioned, a first semiconductor region of a first conductivity type; a second semiconductor region of a second conductivity type; and a third semiconductor region of a first conductivity type are formed; wherein the third semiconductor region is connected to the second contact in an electrically conductive manner; wherein in the second semiconductor region a semiconductor zone of a second conductivity type in which the doping density is increased relative to the basic doping density of the second semiconductor region is arranged such that it separates a first part of the second semiconductor region of the basic doping density arranged closer to the first semiconductor region from a second part of the second semi-conductor region of the basic doping density arranged closer to the third semiconductor region; and wherein a maximum value of the doping density in the semiconductor zone is in a range of greater than $10^{16}$ cm$^{-3}$ and a thickness of the semiconductor zone along the direction from the first contact to the second contact is in a range of smaller than 3 μm.

In accordance with yet another embodiment of the present invention, a vertical semiconductor device is provided having; a semiconductor body; a first contact on a first side of the semi-conductor body; a second contact on a second side of the semiconductor body opposite the first side; wherein in the semiconductor body, in a direction from the first contact to the second contact, in the order mentioned: a first semiconductor region of a first conductivity type; a second semiconductor region of a second conductivity type; and a third semiconductor region of a second conductivity type are formed; wherein a basic doping density of the second semiconductor region is lower than a doping density of the third semiconductor region and the third semiconductor region is electrically connected to the second contact; wherein in the second semiconductor region a semiconductor zone of a second conductivity type in which the doping density is increased relative to the basic doping density of the second semiconductor region is arranged such that it separates a first part of the second semiconductor region of the basic doping density arranged closer to the first semiconductor region from a second part of the second semi-conductor region of the basic doping density arranged closer to the third semiconductor region; and wherein the second semiconductor region has a field stop zone of the second conductivity type.

In accordance with another embodiment of the present invention, a vertical semiconductor device is provided having; a semiconductor body; a first contact on a first side of the semi-conductor body; a second contact on a second side of the semiconductor body opposite the first side; wherein in the semiconductor body, in a direction from the first contact to the second contact, in the order mentioned, a first semiconductor region of a first conductivity type; a second semiconductor region of a second conductivity type; and a third semiconductor region of a first conductivity type are formed; wherein the third semiconductor region is connected to the second contact in an electrically conductive manner; wherein in the second semiconductor region a semiconductor zone of a second conductivity type in which the doping density is increased relative to the basic doping density of the second semiconductor region is arranged such that it separates a first part of the second semiconductor region of the basic doping density arranged closer to the first semiconductor region from a second part of the second semi-conductor region of the basic doping density arranged closer to the third semiconductor region; and wherein the first part of the second semiconductor region has a field stop zone of the second conductivity type.

BRIEF DESCRIPTION OF THE DRAWINGS

Preferred embodiments of the present invention will be detailed subsequently referring to the appended drawings, in which:

FIG. 1a is a schematic cross sectional view of a vertical diode according to a first embodiment of the present invention;

FIG. 3 is a schematic cross sectional view of a vertical diode according to a third embodiment of the present invention; and FIG. 4 is a schematic cross sectional view of an IGBT according to an embodiment of the present invention.

DETAILED DESCRIPTION

Figure 1B:
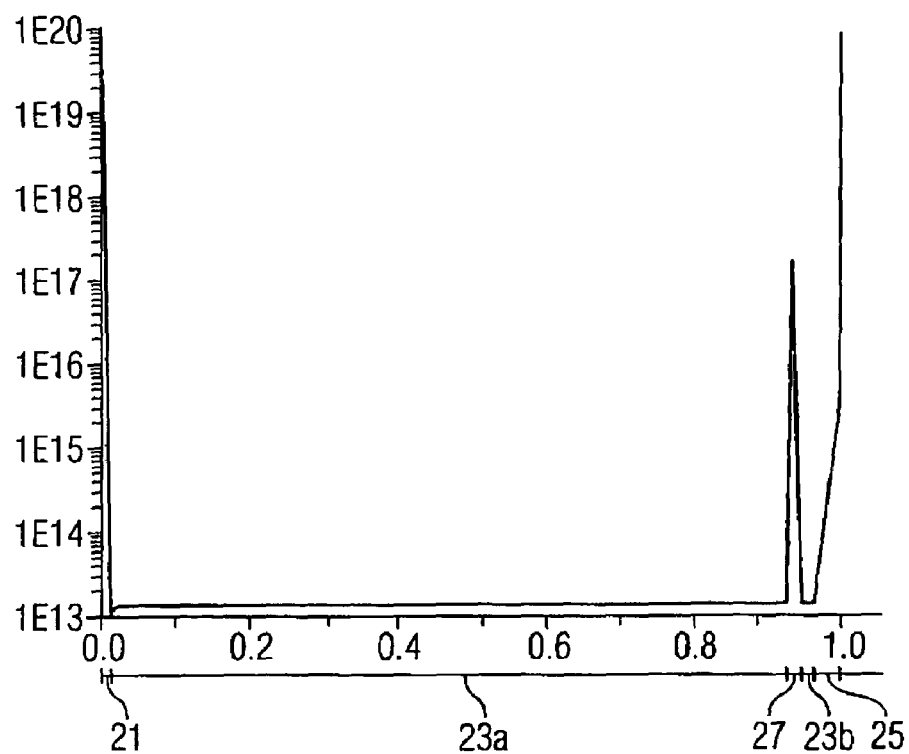
FIG. 1b shows a course of a doping profile in a vertical diode according to a first embodiment of the present invention.

According to a first aspect, one embodiment of the present invention is based on the finding that, in a vertical semiconductor device comprising a p-n junction near a first contact on a first side and a junction between a heavily doped semiconductor region and a lightly doped semiconductor region having the same conductivity type near a second contact on the side opposite to the first contact, a higher doped zone having the same conductivity type as the lightly doped semiconductor region and a higher doping density than the lightly doped semiconductor region may be formed in front of the junction between the lightly doped semiconductor region and the heavily doped semiconductor region in the lightly doped semiconductor region between the p-n junction and the heavily doped semiconductor region such that the maximum field strength of an electric field distribution forming with dynamic switching processes is reduced at the junction between the lightly doped semiconductor region and the heavily doped semiconductor region, such as, for example, halved, since in this case the result is a field distribution having two local maximums in the region in front of the heavily doped semiconductor region near the second contact. Assemblies of semiconductor regions of this kind are, exemplarily, employed in diodes. Thus, the field distribution in the nn-nn$^+$ structure in front of the second contact resulting during shutdown qualitatively has a similar course to that which would form in the stationary case of a p/n/p/n structure.

According to a second aspect, one embodiment of the present invention is based on the finding that, in a vertical semiconductor device having a p-n junction near a first contact on a first side and a p-n junction near a second contact on the second side opposite the first side, a zone comprising higher a doping than the lightly doped semiconductor region and the same conductivity type as the lightly doped semiconductor region can be arranged in a lightly doped semiconductor region between the two p-n junctions such that a field strength of an electric field forming with dynamic switching processes is reduced at the p-n junction near the second contact, such as, for example, halved, since in this case a field distribution forms effectively like in the case of several zones in a p/n/p/n/p structure.

Due to the fact that a more heavily doped zone is formed in the lightly doped semiconductor region, the result is that, instead of a space-charge zone at a p-n junction or a junction between the lightly doped semiconductor region and the heavily doped semiconductor region near the backside, several space-charge zones form in the vertical semiconductor device in dynamic switching processes at the semiconductor device. Thus, a second space-charge zone forms at a junction between the lightly doped semiconductor region and the more heavily doped zone. Due to the fact that another space-charge zone forms between the more heavily doped zone and the lightly doped semiconductor region, an electric field maximum occurring as a consequence of dynamic processes at the vertical semiconductor device is reduced.

Thus, a probability of large-area excessive current in-creases or current filaments occurring as a consequence of feedback between the junction between the heavily doped and the lightly doped zone or the p-n junction on the backside of the vertical semiconductor device and the p-n junction on the front side of the semiconductor device is reduced. The result is that a probability of destroying the device as a consequence of large-area excessive current increases or current filaments occurring is reduced.

Due to the fact that a more heavily doped zone is arranged in the lightly doped semiconductor region in the vertical semiconductor device in a suitable manner, the vertical semiconductor device is protected better against being destroyed in dynamic processes, such as, for example, over-current shutdown, short-circuit loading or down-commuting of a diode.

Put differently, considerations of the present application are that, when one or several buried n-doped zones are placed in a suitable device depth, high electron densities which may, for example, occur in diodes or IGBTs on the backside may be overcompensated in dynamic operation in the region of this n-doped zone or zones. In particular, ac-cording to an embodiment of the present invention, one or several buried n-doped zones are arranged within the lightly doped semiconductor regions or arranged in a suit-able device depth such that in dynamic operation of the vertical semiconductor device, a structure forms between the more heavily doped zone and the lightly doped semiconductor region, the structure comprising a similar electrical performance like an n-p-n-p structure so that the field course occurring on the backside due to the high current densities when, for example, down-commuting is modified according to the so-called Egawa effect (with a backside n-n$^+$ structure) or according to the so called Kirk effect (with a backside n-np$^+$ structure) such that the electric field strength in the vertical direction is reduced noticeable in the surroundings of the wafer backside, namely by widening the space-charge zone or by several space-charge zones occurring in the region of the several buried more heavily doped zones. This results in a noticeable increase in the robustness of the vertical semiconductor device in dynamic processes since the backside field strength maximum may result in a feedback effect with the front side field peak, favoring current filaments to form which may result in the device to be destroyed.

It is to be pointed out here that the vertical semiconductor devices or power semiconductors may also be destroyed in dynamic processes by filament-like current increases which are, for example, caused by cosmic radiation or ionizing radiation. Ionizing radiation thus penetrates the power semiconductor device and generates a local charge carrier accumulation as a consequence of its ionizing effect. The buried n-doped zone also is a protection against destruction of this kind since it contributes to reducing the electric field strength on the backside and thus limits the current increase caused by the ionizing radiation.

Thus, the dynamic loadability of power semiconductor devices with regard to high local or large-area excessive current densities occurring and thus also its resistance to cosmic radiation can be increased by the space-charge zone forming at the buried n-doped zone.

Preferably, the doping density of the more heavily doped zone is selected such that it matches an expected electron current density occurring as a consequence of the dynamic processes in the vertical semiconductor device, i.e. is the doping maximum of this zone is generally to be set to be considerably higher than the doping of a field stop zone in the device, which determines the static blocking capability. Preferably, in a vertical semiconductor device according to an embodiment of the present invention, a course of the doping density in the more heavily doped zones is set such that the doping density decreases more slowly along a path from a doping maximum in the more heavily doped zone towards the second contact on the backside or the wafer backside than along a path from the doping maximum towards the first contact. The result is that the space charge is higher in the region between the doping maximum and the boundary of the lightly doped semiconductor region facing the second contact than in the region between the doping maximum and the boundary of the lightly doped semiconductor region facing the first contact. Thus, a probability of excessive local current densities occurring as a consequence of the dynamic processes at the semiconductor device near the backside where the second contact is arranged is reduced due to the higher space-charge density present there.

In contrast to a conventional field stop, it is characteristic of the inventive zone that its doping maximum is as high as possible and its vertical extension is as small as possible. When several such zones are used, they are spaced apart from one another. A combination with a conventional field stop is also possible.

In a vertical semiconductor device according to an embodiment of the present invention, the depth where the n-doped zone is arranged within the lightly doped semiconductor region and the doping course of the n-doped zone may be selected or adjusted such that the static blocking capability and softness are not effected too much when shutting down. Thus, it is of advantage to form two or three narrow n-doped zones each comprising the same maximum doping concentration and the narrowest possible vertical extension near the second contact on the backside of the vertical semiconductor or near the wafer backside. Furthermore, a respective distance is to be selected between these buried n-doped zones which is sufficient for space-charge zones to extend between these zones.

In order to optimize softness when shutting down, optionally an additional lightly doped field stop zone may be provided which, from the point of view of the semiconductor backside, is deeper in the semiconductor body than the n-doped inventive zone described above or the n-doped inventive zone described above. The field stop zone, however, may also abut directly on the narrow n-doped zone. It is also possible for the narrow n-doped zone to be embedded in the field stop zone. The n-doped zone thus has a higher maximum doping density value than the maximum doping density value of the field stop zone.

FIG. 1a shows a vertical diode 11 according to a first embodiment of the present invention. The vertical diode 11 comprises a semiconductor body 12 having a first terminal 13, namely an anode, on a first side of the vertical semiconductor body 12 and a second terminal 15, namely a cathode, on a second side of the vertical semiconductor body 12. The anode 13 contacts the semiconductor body via a first contact or anode contact 17 arranged on the first side of the vertical diode 11 and the cathode 15 contacts the semiconductor body 12 via a second contact or cathode contact 19 from the other side. A p-doped semiconductor region or p-semiconductor region 21, a lightly n-doped semiconductor region or n⁻-doped semiconductor region 23 and a heavily n-doped semiconductor region or n⁺-doped semiconductor region 25 or n-emitter 25 are formed in the order mentioned from the anode contact 17 to the cathode contact 19 in the semiconductor body 12 of the vertical diode 11. The more heavily n-doped zone 27 the meaning of which will be described in greater detail below is formed in n⁻-doped semiconductor region 23.

The n-doped zone 27 is arranged in the n⁻-doped semiconductor region 23 and divides the n⁻-doped semiconductor region 23 into a first n⁻-doped subregion 23a of the n⁻-doped semiconductor region 23 and a second n⁻-doped subregion 23b of the n⁻-doped semiconductor region 23. The p-semiconductor region 21 abuts on the first anode contact 17, whereas the n⁺-doped semiconductor region 25 abuts on the cathode contact 19.

The dimensions of the subareas 23a, 23b and of the n-doped zone 27 are shown on the left-hand side in FIG. 1a. Thus, a constant $l_1$ stands for a vertical extension or extension in the direction from the anode contact 17 to the cathode contact 19 or vice versa or a width of the first subregion 23a and a constant $l_2$ stands for a vertical extension or width of the second subregion 23b. A constant b stands for a vertical extension or width or thickness of the n-doped zone 27.

The doping doses of the regions or zones may thus be determined along a direction from the anode contact 17 to the cathode contact 19 using the following formulae (1)-(4):

A doping dose $d_1$ of the first subregion 23a results from the following formula:

$$d_1 = \int_0^{l_1} n_D \, dx \tag{1}$$

In the above formula (1), $n_D$ stands for a doping density of the n⁻-doped semiconductor region 23, namely of the basic doping of the semiconductor body 12. Thus, integration is performed along a line dx in the direction from the first contact 17 to the second contact 19 in the first subregion 23a, i.e. from a junction or boundary between the p-doped semiconductor region 21 and the first subregion 23a of the n⁻-doped semiconductor region 23 to the junction or boundary between the first subregion 23a of the n⁻-doped semiconductor region 23 and the n-doped zone 27, over the doping density $n_D$ of the n⁻-doped semiconductor region 23.

A doping dose D of the n-doped zone 27 results from the following formula (2):

$$D = \int_0^b N_D \, dx \quad (2)$$

In the above formula (2), a variable $N_D$ stands for a doping density of the n-doped zone 27. Thus, integration is performed along a line dx in the direction from the anode contact 17 to the cathode contact 19 in the n-doped zone 27, i.e. from a junction facing the anode contact 17 or boundary between the first subregion 23a of the n⁻-doped semiconductor region 23 and the n-doped zone 27 to a junction facing the cathode contact 19 between the n-doped zone 27 and the second subregion 23b of the n⁻-doped semiconductor region 23, over the doping density $N_D$ of the n-doped zone 27.

A doping dose $d_2$ of the second subregion 23b results from the following formula:

$$d_2 = \int_0^{l_2} n_D \, dx \quad (3)$$

In the above formula, integration is performed along a line dx in the direction from the anode contact 17 to the cathode contact 19 in the second subregion 23b, i.e. from a junction or boundary between the n-doped zone 27 and the second subregion 23b of the n⁻-doped semiconductor region 23 to the junction or boundary between the second subregion 23b of the n⁻-doped semiconductor region 23 and the n⁺-doped semiconductor region 25, over the doping density $n_D$ of the n⁻-doped semiconductor region 23.

A doping dose $d_{ges}$ of the n⁻-doped semiconductor region 23 within the n⁻-doped subregions 23a, 23b can be established from a sum of the doping dose $d_1$ of the first subregion 23a and the doping dose $d_2$ of the second subregion 23b, as is illustrated in formula (4).

$$d_{ges} = d_1 + d_2 \quad (4)$$

In the vertical diode 11, it applies for the doping dose $d_{ges}$ of the n⁻-doped semiconductor region 23 within the subregions 23a, 23b and the doping dose D of the n-doped zone 27 that a ratio of the doping dose D of the n-doped zone 27 to a doping dose of the n⁻-doped semiconductor region 23 within the subregions 23a, 23b is in a range from 0.1 to 10. Thus, the ratio $l_2/(l_1+b+l_2)$ exemplarily is in a range from 0.01 to 0.2, preferably in a range from 0.05 to 0.2 or 0.02 to 0.1, and even more preferably in a range from 0.05 to 0.1, and the ratio $b/(l_1+b+l_2)$ is preferably in a range from 0.001 to 0.05 and, even more preferably, in a range from 0.002 to 0.02. The maximum value of the doping density or of the doping density profile in the direction of thickness of the n-doped zone 27 thus is in a range of greater than $10^{16}$ cm⁻³ and preferably in a range from $10^{16}$ cm⁻³ to $10^{18}$ cm⁻³ or even in a range from $10^{17}$ cm⁻³ to $10^{18}$ cm⁻³. The thickness of the n-doped zone 27 is in a range of smaller than 3 μm and, preferably, in a range from 0.1 μm to 2 μm and, even more preferably, below 1 μm. The doping dose of the n-doped zone thus preferably is in a range from $10^{11}$ cm⁻² to $10^{14}$ cm⁻² and, even more preferably, between $10^{12}$ cm⁻³ and $10^{14}$ cm⁻³ or even $10^{13}$ cm⁻³ to $10^{14}$ cm⁻³.

Since the value of the doping density in the n-doped zones preferably decreases from a doping density maximum towards the edges of the n-doped zones 27, 53, the thickness of the n-doped zones 27, 53 is exemplarily defined such that the doping density at the edge of the n-doped zones is each increased by a value of 10% of the difference of the doping density maximum of the n-doped zones and the basic doping density relative to the basic doping density of the n⁻-doped semiconductor region 23. Put differently, the doping density at an edge of the n-doped zones 27, 53 has decreased by 90% of the difference of the maximum doping density value in the n-doped zones 27, 53 and the doping density of the n⁻-doped semiconductor region 23 relative to the maximum doping density value of the n-doped zones. The doping density D of the n-doped zones 27, 53 can be determined, as has already been mentioned above, according to the formula (2).

FIG. 1b shows the schematic course of the doping densities of the vertical diode 11 according to a first embodiment of the present invention. The positions of the regions 23a, 27, 23b in the vertical diode 11 are plotted at the x-axis. The dimensions of the respective regions or zones are thus plotted in a normalized manner to the entire width or vertical extension of the vertical diode 11. The dimensions of the regions are thus plotted in a direction from the anode contact 17 to the cathode contact 19. The doping density is plotted in a logarithmic manner on the y-axis. The maximum doping concentration of the n-doped zone 27 is in a range from $10^{16}$ cm⁻³ to $10^{18}$ cm⁻³.

Figure 1C:
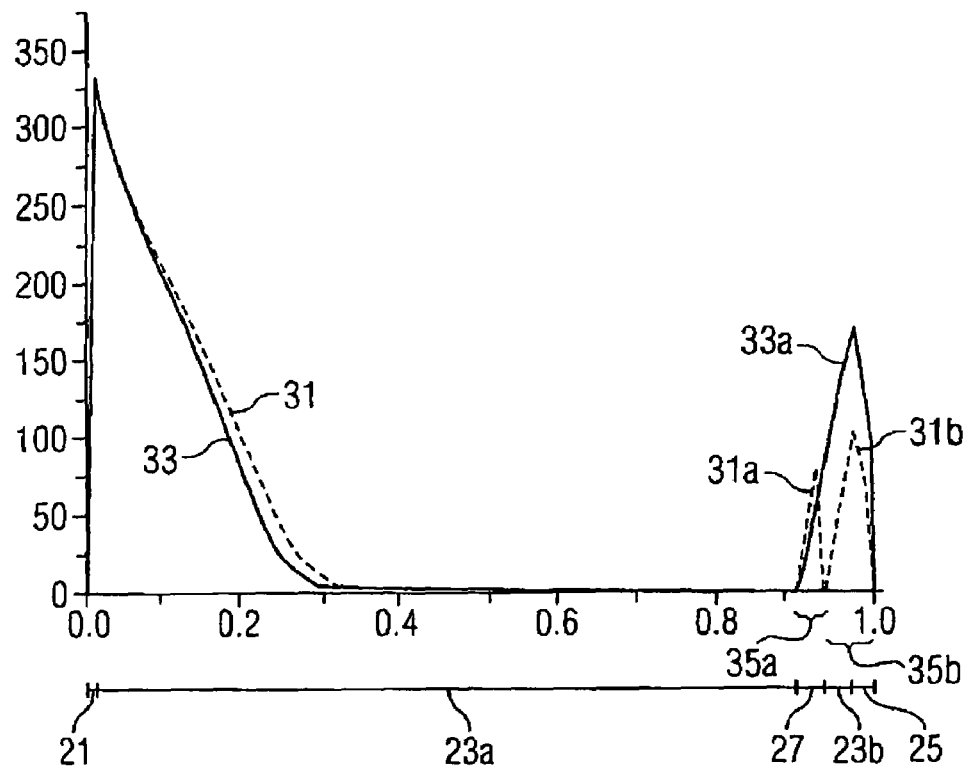
FIG. 1c shows a course of the electric field strengths in a vertical diode according to a first embodiment of the present invention.

FIG. 1c shows a snapshot of the course of the electric field strength in the vertical diode 11 when a reverse voltage is applied to the vertical diode 11 and down-commuting of the charge carriers takes place. The positions of the regions 23a, 27, 23b in the vertical diode 11 are plotted at the x-axis in a normalized manner to the entire width or vertical extension of the vertical diode 11. Thus, the dimensions are, like in FIG. 1b, plotted along a direction from the anode contact 17 to the cathode contact 19. The electric field strength value in kV/cm or kilo volt per cm is plotted on the y-axis. A curve 31 shows the vertical course of the electric field strength along the direction from the anode contact 17 to the cathode contact 19 in the inventive diode 11. This course is characterized by the existence of a first field strength maximum 31a and a second field strength maximum 31b near the backside.

For comparative purposes, a curve 33 illustrates a course of the electric field strength in the vertical diode 11 which would form without the n-doped zone 27 in the n⁻-doped semiconductor region 23. The course of the electric field strength in the diode without the n-doped zone only comprises a single field strength maximum 33a near the backside.

Two space-charge zones 35a and 35b which may be defined due to the two backside field strength maximums forming are also illustrated in FIG. 1c for the inventive diode. Without the n-doped zone, the result would only be one space-charge zone as can be recognized from the course 33 of the electric field strength.

Due to the fact that two space-charge zones 35a, 35b form when, for example, the reverse voltage is applied at a time of shutting down, the field strength maximum occurring on the backside of the vertical diode 11, i.e. the second field strength maximum 31b, is reduced. Thus, the maximum backside field strength 31b can be reduced by the additional space-charge zone forming at the junction between the n-doped zone 27 and the n⁻-doped semiconductor region 23.

The maximum electric field strength on the backside here occurs in the space-charge zone forming at the junction between the n⁺-doped semiconductor region 25 or n-emitter and the n⁻-doped semiconductor region 23. The reason for the reduction or decrease in the maximum field strength value occurring on the backside of the diode 11 with a higher number of space-charge zones forming is that higher a voltage can be taken up with smaller an electric field strength by the additional space-charge zone forming.

At the same time, the voltage drop occurring can be established by integrating the electric field strength in a vertical direction over the overall width of the space-charge zones forming. If only the number of the space-charge zones forming is increased, the overall width of the space-charge zones along which integration takes place over the electric field strength will increase, too. With a constant voltage drop this means that the electric field strength resulting is reduced, which also results in a reduction in the field strength maximum. Thus, the reduction of the field strength maximum is of decisive importance to reduce a probability of current filaments or large-area excessive current increases occurring and thus to reduce a probability of the vertical diode being destroyed.

Exemplarily, a maximum electric field strength occurring at a corresponding reverse voltage may be reduced by the n-doped zone 27 by about 40% from a value of 167 kV/cm to a value of 101 kV/cm, as is shown in FIG. 1c.

Figure 2A:
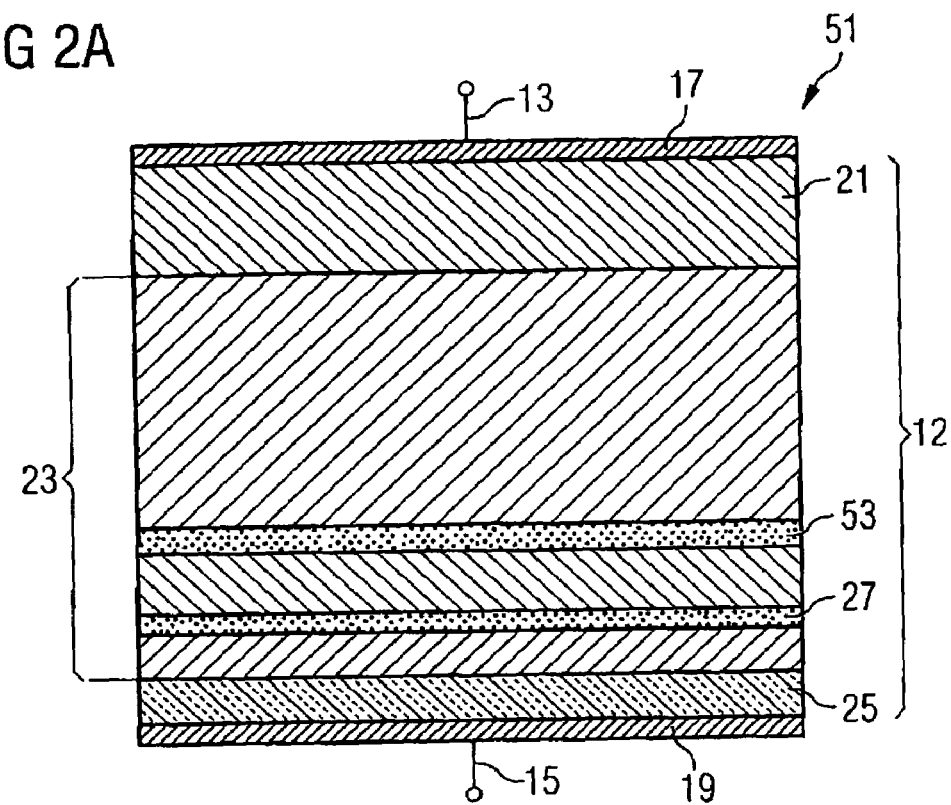
FIG. 2a is a schematic cross sectional view of a vertical diode according to a second embodiment of the present invention.

FIG. 2a shows a schematic cross sectional view of a vertical diode 51 according to a second embodiment of the present invention. Subsequently, same elements or elements having the same effect like in the vertical diode 11 shown in FIG. 1a will be provided with the same reference numerals. Furthermore, the description of the setup and function of the vertical diode 51 according to a second embodiment of the present invention will be restricted to the differences to the vertical diode 11 according to a first embodiment of the present invention shown in FIG. 1a.

In contrast to the vertical diode 11, the vertical diode 51 according to a second embodiment of the present invention comprises another n-doped zone 53 which is formed in the n$^-$-doped semiconductor region 23. The further n-doped zone 53 is thus spaced apart from the n-doped zone 27 so that a subregion of the n$^-$-doped semiconductor region 23 is arranged between the n-doped zone 27 and the further n-doped zone 53. The further n-doped zone 53 may, however, also abut on the n-doped zone 27.

The further n-doped zone 53 comprises higher a doping density than the n$^-$-doped semiconductor region 23. Preferably, the width of the further n-doped zone 53 is similar to the width of the n-doped zone 27 so that a ratio of the width of the further n-doped zone 53 to a width of the n-doped zone 27 is in a range from 30% to 300%. Preferably, a course of the doping density in the further n-doped zone 53 is similar to a course of the doping density in the n-doped zone 27, always in a direction from the anode contact 17 to the cathode contact 19.

If a reverse voltage is, for example, applied to the vertical diode 51 in dynamic processes, such as, for example, shutdown, another space-charge zone will form at the further n-doped zone 53. The further space-charge zone forming results in the electric field strength maximum on the backside of the vertical diode being further reduced compared to the vertical diode 11 shown in FIG. 1a.

Figure 2B:
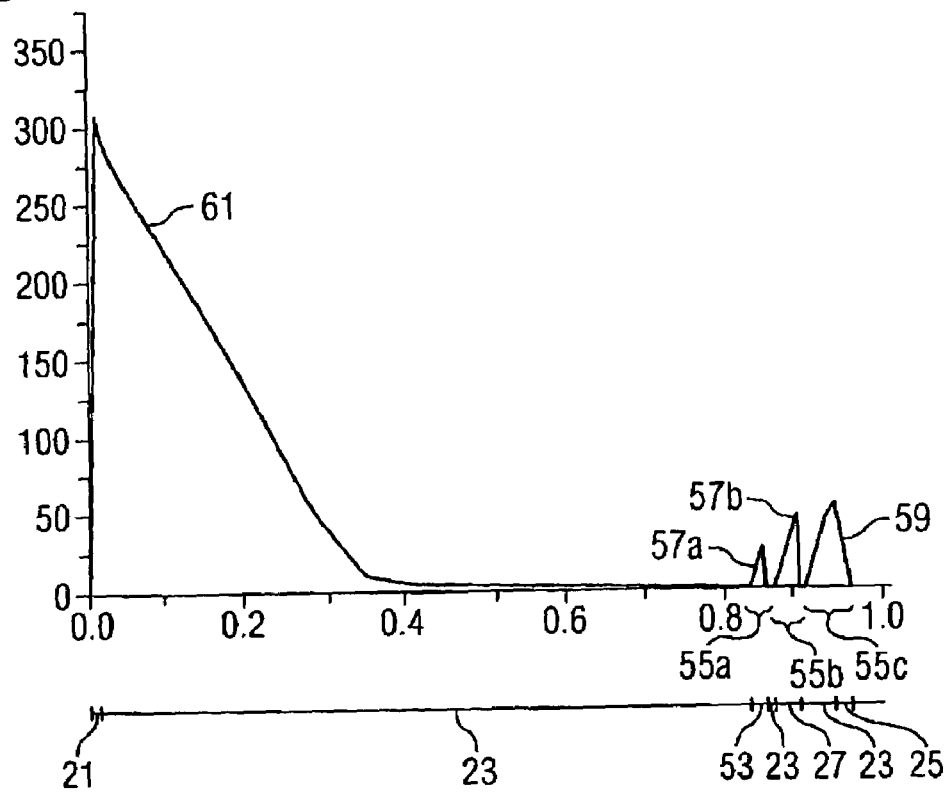
FIG. 2b shows a course of the electric field strength in the vertical diode according to a second embodiment of the present invention.

FIG. 2b shows a course of the electric field strength in the vertical diode 51 along a direction from the anode contact 17 to the cathode contact 19 when a reverse voltage is applied to the vertical diode 51. The positions of the regions 23, 53, 27 and 25 in the vertical diode 51 are indicated at the x-axis. The dimensions of the respective zones and semiconductor regions are plotted on the x-axis in a manner normalized to the width of the vertical diode 51, whereas the electric field strength values in kV/cm are plotted on the y-axis.

It an be recognized using the course of the electric field strength in the vertical diode 51 that the results are three space-charge zones, namely a first space-charge zone 55a, a second space-charge zone 55b and a third space-charge zone 55c. The first space-charge zone 55a forms starting from the further n-doped zone 53 in the n$^-$-doped semiconductor region 23, whereas the second space-charge zone forms starting from the n-doped zone 27 in the n$^-$-doped semiconductor region 23. The third space-charge zone 55c forms at the junction between the n$^-$-doped semiconductor region 23 and the n$^+$-doped semiconductor region 25.

The course of the electric field strength in the vertical diode 51 comprises three field strength maximums, namely a field strength maximum 57a in the first space-charge zone 55a, a field strength maximum 57b in the second space-charge zone 55b and a field strength maximum 59 on the backside. Compared to a field strength course in the vertical diode 11 according to a first embodiment of the present invention shown in FIG. 1c, three space-charge zones instead of two form when shutting down the diode to a reverse voltage in the vertical diode 51. At the same time, a value of the field strength maximum 59 on the backside of the vertical diode 51 is smaller than the value of the second field strength maximum 31b also occurring on the backside of the vertical diode.

The vertical diode 51 comprises the further n-doped zone 53 which is, as is the n-doped zone 27, also arranged in the n$^-$-doped semiconductor region 23. Thus, the vertical diode 51 comprises two inventive n-doped zones 27, 53 in contrast to the vertical diode 11 which only comprises the n-doped zone 27. Thus, two additional space-charge zones form in the vertical diode 51 at the junctions between the n-doped zones 27, 53 and the n$^-$-doped semiconductor region 23, whereas only one additional space-charge zone forms in the vertical diode 11 at a junction between the n-doped zone 27 and the n$^-$-doped semiconductor region 23.

The result in the vertical diode 51 is that the overall width of all the space-charge zones along which integration is performed over the electric field strength to establish the voltage drop at the vertical diode 51 is increased. Thus, with a predefined voltage drop at the diode 51, the electric field strength occurring and thus the field strength maximum 59, too, are reduced compared to the field strength maximum 31b in the vertical diode 11.

In order for the space-charge zones to be able to spread sufficiently, the distance between the n-doped zones 53, 27 and/or the distance between the n-doped zone 27 and the third semiconductor region 25 should be between 1 and 10 μm, preferably between 1 and 5 μm and particularly preferably between 1 and 3 μm.

The further reduction of the electric field strength maximum on the backside has the result that the probability of current filaments occurring as a consequence of feedback effects with a field peak 61 on the front side of the vertical diode 51 or the probability of large-area excessive current increases occurring is further reduced. Thus, a probability of a destruction of the vertical diode as a consequence of current filaments or large-area excessive current increases occurring is reduced. Since the current filaments can also occur as a consequence of a local charge carrier accumulation due to the ionizing effect of cosmic radiation, the vertical diode 51 thus is at the same time more robust against the influence of current filaments caused by cosmic radiation.

FIG. 3 shows a schematic cross sectional view of a vertical diode 101 according to a third embodiment of the present invention. Subsequently same elements or elements having the same effect as the vertical diode 51 according to a second embodiment of the present invention shown in FIG. 2a will be provided with the same reference numerals. Furthermore, the description of the setup and function of the vertical diode 101 according to a third embodiment of the present invention will be restricted to the differences to the setup and function of the vertical diode 51 shown in FIG. 2.

In contrast to the vertical diode 51, the vertical diode 101 according to a third embodiment of the present invention comprises a field stop zone 103 which is arranged in the n⁻-doped semiconductor region 23 and divides same into a region above the field stop zone 103 and a region below the field stop zone 103. The field stop zone 103 has a width B or vertical extension, as is indicated in FIG. 3. The field stop zone 103 is n-doped and comprises higher a doping density than the n⁻-doped semiconductor region 23.

The field stop zone 103 is spaced apart from the n-doped zone 27 and the further n-doped zone 53 and separated each from same by a part of the n⁻-doped semiconductor region 23. The distance between the field stop zone and the n-doped zones 27, 53 thus, for example, is greater than 10 μm. The field stop zone 103 may, however, also abut directly on the zone 53. Also, it is possible for the zone 53 and maybe even the zone 27 to be embedded into the field stop zone 103. The field stop zone 123 may even reach as far as to the zone 25. Thus, the field stop zone 103 preferably has lighter a doping than the n-doped zone 27 and the further n-doped zone 53. Furthermore, the field stop zone 103 has greater a width than the n-doped zone 27 and the further n-doped zone 53. If the field stop zone 103 abuts on the n-doped zone 27, 53 or the n-doped zones 27, 53 are all or partly arranged in the field stop zone 103, the n-doped zone will differ from the field stop zone in that the n-doped zone 27, 53 has higher a maximum doping density value than the field stop zone 103. A ratio of the maximum doping density value of the n-doped zone 27, 53 to a maximum doping density value of the field stop zone 103 thus preferably is in a range from 10 to $10^3$. The layer thickness of the n-doped zones 27, 53 thus preferably is in a range of smaller than 3 μm. The doping density value of the n-doped zones 27, 53 decreases from the doping density maximum towards the edges of the n-doped zones 27, 53. The thickness of the n-doped zones 27, 53 may thus be defined as the distance of the points along the depth direction (vertically in FIG. 3) where the doping density of the n-doped zones 27, 53 is increased by a value of 10% of the difference of the maximum doping density of the n-doped zones 27, 53 and the doping density of the field stop zone 103 compared to the latter. Put differently, the doping density at the boundary of the n-doped zones 27, 53 defined in this way to the field stop zone 103 has decreased by 90% of the difference of the maximum value of the doping density in the n-doped zone and the doping density of the field stop zone.

At the same time, the field stop zone preferably has lower a gradient of the vertical doping course in the part of the field stop zone 103 facing the first terminal 13 than in the part of the field stop zone facing the second terminal 15.

A doping dose $d_{field}$ of the field stop zone 103 can be established from formula (5).

$$d_{field} = \int_0^B n_{D\_field} \, dx \quad (5)$$

In formula (5), a variable $d_{field}$ stands for a doping dose of the field stop zone 103. A variable $n_{D\_field}$ stands for a concentration of the donors or a doping density of the field stop zone 103, whereas a variable B stands for a width, i.e. the extension in the vertical direction, of the field stop zone 103. In the formula (5), thus integration is performed along a path dx in a direction from the anode contact 17 to the cathode contact 19 from a junction of the field stop zone 103 to the n⁻-doped semiconductor region 23 facing the anode contact 17 to a junction between the n⁻-doped semiconductor region 23 and the field stop zone 103 facing the cathode contact 19, over the doping density $n_{D\_field}$ of the field stop zone 103.

It applies for the vertical diode 101 according to a third embodiment of the present invention that the doping dose $d_{field}$ of the field stop zone 103 is in a range from $5 \times 10^{10}$ cm$^{-2}$ to $10^{12}$ cm$^{-2}$, whereas a maximum value of the doping density of the field stop zone 103 is preferably smaller than some $10^{16}$ cm$^{-3}$ and, particularly preferably, in a range from $10^{14}$ to $10^{16}$ cm$^{-3}$. A thickness of the field stop zone preferably is in a range of greater than 3 μm and more preferably in a range from 10 μm to 30 μm.

The further n-doped zone 53 preferably has the same parameters like the parameters for the n-doped zone 27 described referring to FIG. 1a. The doping dose of the n-doped zones 27, 53 thus preferably each is in a range from $10^{11}$ cm$^{-2}$ to $10^{14}$ cm$^{-2}$, whereas a maximum value of the doping density of the n-doped zones is in a range of greater than $10^{16}$ cm$^{-3}$ and preferably in a range from $10^{16}$ cm$^{-3}$ to $10^{18}$ cm$^{-3}$. At the same time, the thickness of the n-doped zones 27, 53 is in a range of smaller than 3 μm and preferably in a range of 0.1 μm to 2 μm and even more preferably below 1 μm.

When shutting down or down-commuting the diode, a space-charge zone may form at the field stop zone 103. The dopant concentration in the field stop zone thus may be implemented such that the space-charge zone forming spreads in a retarded manner with an increasing reverse voltage. When a space-charge zone is spreading, an overflow charge will always be cleared from the regions into which the space-charge zone is spreading.

As long as an increase in the reverse voltage entails clearing a charge packet of the overflow charge, i.e. as long as the process of clearing is not interrupted, the reverse voltage cannot increase sharply. Thus, the switching course of the vertical diode 101 remains soft. Thus, when shutting down a voltage applied to the vertical diode 101 or hard down-commuting, the voltage or current oscillation occurring an be attenuated. Thus, the performance of the vertical diode 101 when down-commuting the vertical diode 101 can be stabilized by the field stop zone 103.

In order to achieve good softness or a good switching course, the field stop zone or doping course which, from the point of view of the wafer backside is arranged below the n-doped zones 23, 53 or the doping peaks could preferably be set such that the result is a dopant concentration course as is described in the unpublished patent application No. 10 2004 047 749.3. This document explains that the dopant concentration course in the semiconductor body 12 is formed such that the integral of the ionized dopant charge relative to the semiconductor body 12, starting from a p-n junction provided between the anode contact 17 and the field stop zone 103, in the direction of the cathode contact 19 will only reach a charge amount corresponding to the break through charge of the vertical diode 101 (which, for silicon, is between $1 \times 10^{12}$ cm$^{-2}$ and $2 \times 10^{12}$ cm$^{-2}$) near the interface of the field stop zone 103 facing the cathode contact, wherein the p-n junction is the last p-n junction in front of the field stop zone 103, relative to a direction from the anode contact 17 to the cathode contact 19.

A maximum field strength occurring during the commuting process in the vertical diode 101 on the backside of the vertical diode 101 can be reduced by the n-doped zone 27 arranged between the field stop zone 103 and the n⁺-doped semiconductor region 25 and the further n-doped zone 53. This in turn results in a probability of current filaments occurring in the vertical diode 101 to be reduced, which reduces a probability of destroying the vertical diode 101.

FIG. 4 shows a schematic cross sectional view of a vertical IGBT (insulated gate bipolar transistor) 201 according to an embodiment of the present invention. The vertical IGBT 201 comprises a first IGBT terminal 153 on a first side of the IGBT 201 and a second IGBT terminal 155 on a second side of the IGBT 201 opposite the first side. Furthermore, the vertical IGBT 201 includes a first IGBT contact 157 on the first side and a second IGBT contact 159 on the second side.

A semiconductor body 160 is positioned between the first IGBT contact 157 and the second IGBT contact 159. A p-body region 167, a lightly n-doped semiconductor region or n⁻-doped semiconductor region 171 and a p-doped backside emitter or p-backside emitter 169 are arranged in the semiconductor body 160 in the direction from the first IGBT contact 157 to the second IGBT contact 159. The p-backside emitter 169 abuts on the second IGBT contact 159 and is connected to same in an electrically conductive manner.

An n-doped zone 173 having a width or thickness y or a vertical extension from the first IGBT contact 157 to the second IGBT contact 159 which divides the n⁻-doped semiconductor region 171 into a first subregion 171a of the n⁻-doped semiconductor region 171 having a width $z_1$ or a vertical extension from the first IGBT contact 157 to the second IGBT contact 159 and a second subregion 171b of the n⁻-doped semiconductor region 171 of a width $z_2$ or vertical extension from the first IGBT contact 157 to the second IGBT contact 159 is formed in the n⁻-doped semiconductor region 171. The n-doped zone 173 comprises higher a doping density than the n⁻-doped semiconductor region 171. A source region 165 abutting on the first IGBT contact 157 and being connected to same in an electrically conductive manner is arranged in the p-body region 167. Additionally, a field stop zone 203 arranged between the n-doped zone 173 and the p-body region 167 is formed in the semiconductor body 160.

The field stop zone 203 has a vertical extension in a direction from the first IGBT contact 157 to the second IGBT contact 159 or width w.

The field stop zone 203 is formed in the n⁻-doped semiconductor region 171 and separated from the n-doped zone 173 by a part of the n⁻-doped semiconductor region 171. The field stop zone is, for example, spaced apart from the n-doped zone 173 by a distance of more than 3 μm. The field stop zone 203 has higher a doping than the n⁻-doped semiconductor region 171. Preferably, the doping density of the field stop zone 203 is smaller than that of the n-doped zone 173. The width w of the field stop zone 203 preferably is at the same time greater than the width y of the n-doped zone 173. However, the field stop zone 203 may also abut directly on the zone 173. It is also possible for the zone 173 to be embedded into the field stop zone 203. The field stop zone 203 may even extend as far as to the backside emitter 169.

An insulation layer 161 and a gate electrode 163 are positioned between two source regions 165, the two p-doped body regions 167 and the n⁻-doped semiconductor region 171. Thus, the gate electrode 163 is completely surrounded by the insulation layer 161.

The source regions 165 partly abut on the insulation layer 161 and partly on the first IGBT contact 157. At the same time, a part of the n⁻-doped semiconductor region 171 is positioned between the two p-doped body regions 167.

A doping dose $d_{F\_IGBT}$ of the field stop zone 203 can be established from formula (6).

$$d_A = \int_0^{z_1} n_{D\_IGBT} dx \quad (6)$$

A variable $n_{D\_F\_IGBT}$ stands for a concentration of the donors in the field stop zone 203 or a doping density of the field stop zone 203. In the formula (6), integration is thus performed along a path dx in a direction from the first IGBT contact 157 to the second IGBT contact 159 from a junction of the field stop zone 203 to the n⁻-doped semiconductor region 171 facing the first IGBT contact 157 to a junction between the n⁻-doped semiconductor region 171 and the field stop zone 203 facing the second IGBT contact 159, over the doping density $n_{D\_F\_IGBT}$ of the field stop zone 203.

A doping density D of the n-doped zone 173 results from the following formula:

$$D_{IGBT} = \int_0^y N_{D\_IGBT} dx \quad (7)$$

In the above formula (7), a variable $N_{D\_IGBT}$ stands for a doping density of the n-doped zone 173. In the above formula (7), integration is performed along a line dx in the direction from the first IGBT contact 157 to the second IGBT contact 159 in the n-doped zone 173, i.e. from a transition facing the first IGBT contact 157 or boundary between the first subregion 171a of the n⁻-doped semiconductor region 171 and the n-doped zone 173 to a transition facing the second IGBT contact 159 between the n-doped zone 173 and the second subregion 171b of the n⁻-doped semiconductor region 171, over the doping density $N_{D\_IGBT}$ of the n-doped zone 173.

For an IGBT 201 manufactured from silicon according to an embodiment of the present invention, it applies that the doping dose $d_{field}$ of the field stop zone 203 is in a range from $5 \times 10^{10}$ cm⁻² to $10^{12}$ cm⁻², whereas a maximum value of the doping density of the field stop zone 203 is smaller than some $10^{16}$ cm⁻³ and preferably is in a range from $10^{14}$ to $10^{16}$ cm⁻³. A thickness of the field stop zone 203 thus preferably is in a range from 10 μm to 30 μm.

The doping dose of the n-doped zone 173 preferably is in a range from $10^{11}$ cm⁻² to $10^{14}$ cm⁻² and even more preferably in a range from $10^{12}$ cm⁻³ to $10^{14}$ cm⁻³ or even between $10^{13}$ cm⁻³ and $10^{14}$ cm⁻³. A maximum value of the doping density of the n-doped zone 173 is in a range of greater than $10^{16}$ cm⁻³ and preferably in a range from $10^{16}$ cm⁻³ to $10^{18}$ cm⁻³ or even $10^{17}$ cm⁻³ to $10^{18}$ cm⁻³. At the same time, the thickness of the n-doped zones 27, 53 is in a range of smaller than 3 μm and preferably in a range from 0.1 μm to 2 μm and even more preferably below 1 μm.

Since the doping density value in the n-doped zone 173 preferably decreases from a doping density maximum towards the edges of the n-doped zone 173, the thickness of the n-doped zones 173 is exemplarily defined such that the doping density at the edge of the n-doped zone increases by a value of 10% of the difference of the maximum of the doping density of the n-doped zone 173 and the basic doping density of the n⁻-doped semiconductor region 171 compared to the basic doping density of the n⁻-doped semiconductor region 171. Put differently, the doping density at an edge of the n-doped zone 173 has decreased from the maximum value by 90% of the difference of the maximum value of the doping density of the n-doped zone 173 and the doping density of the n⁻-doped semiconductor region 171.

When applying a corresponding potential to the gate electrode 163, a conducting connection is produced between the source region 165 and the n⁻-doped semiconductor region 171 so that the IGBT performs like a forward-biased diode.

When shutting down or down-commuting the vertical IGBT 201, a reverse voltage may form at the IGBT 201 like in the vertical diode 11, 51, 101 according to the embodiment of the present invention. This reverse voltage results in a space-charge zone forming between the p-doped body region 167 of the vertical IGBT 201 and the n⁻-doped semiconductor region 171. In this case, too, a space-charge zone may again form under extreme switching conditions at the n-doped zone 173, which according to the principle discussed in FIG. 1a has the result that a local field strength maximum in the space-charge zone forming at the field stop zone 203 is reduced.

Thus, a probability of breakdown as a consequence of feedback effects between the field strength maximum on the backside of the vertical IGBT 201, and a field peak at the space-charge zone forming at the field stop zone in turn is reduced. These feedbacks in turn may result in current filaments or large-area excessive current increases in the vertical IGBT 201 which may result in destroying the vertical IGBT 201. A probability of the current filaments or large-area excessive current increases forming in dynamic processes is reduced by a reduction of the field strength maximum in the space-charge zone forming at the field stop zone so that a probability of destroying the vertical IGBT 201 is reduced.

The performance of the IGBT 201 is described Subsequently. If a reverse voltage is applied to the vertical IGBT 201 according to an embodiment of the present invention, the space-charge zone between the p-doped p-body region 167 and the n⁻-doped semiconductor region 171 will spread to the n⁻-doped semiconductor region 171. It will then reach the field stop zone 203 where there is an increased amount of free charge carriers. The space-charge zone clears the charge packets in the field stop zone 203 so that an increase in the reverse voltage goes hand in hand with clearing the overflow charge in the field stop zone 203. This avoids a sudden increase in the reverse voltage at the vertical IGBT 201. The field stop zone 203 thus serves to stabilize the performance of the IGBT 201 when shutting down the IGBT and to attenuate oscillations occurring.

The doping course in the field stop zone 203 in turn may be set like in the unpublished patent application No. 10 2004 047 749.3.

Due to the space-charge zone forming at the n-doped zone 173, a local field strength maximum at the field stop zone of the vertical IGBT 201 occurring when applying a reverse voltage to the IGBT 201 in dynamic processes is reduced at the same time. The reduction in the field strength maximum at the field stop zone of the vertical IGBT 201 results in a decrease in the probability of current filaments occurring. Thus, a probability of destroying the vertical IGBT 201 is reduced.

In analogy to the IGBT shown in FIG. 4, an inventive zone 173 may also be formed in an MOSFET. Such an MOSFET is largely similar or equal in its setup to the IGBT 201, wherein the p-backside emitter 169 is replaced by an n-doped drain zone. The field stop zone 203 may be omitted in an MOSFET.

The drain zone thus has higher a doping density than the n⁻-doped semiconductor region 171. A ratio of the doping density of the drain zone to a doping density of the n⁻-doped semiconductor region 171 will then preferably be in a range of greater than 10 and more preferably in a range from $10^2$ to $10^7$.

If the field stop zone 203 is omitted in the MOSFET, the context already explained in the vertical diode 51 applies to the doping doses of n-doped zone and the doping dose of the n⁻-doped semiconductor region 171. The doping dose of the first subregion 171a is thus established in correspondence to the context in the vertical diode 51 by means of an integration of the doping density along the path dx over the width or thickness $z_1$ of the first subregion 171a. The doping dose of the second subregion 171b thus is established in correspondence with the context in the vertical diode 51 by means of an integration of the doping density along the path dx over the width or thickness $z_2$ of the second subregion 171b. The doping dose of the n⁻-doped semiconductor region 171 will then again be established in correspondence with the doping dose of the n⁻-doped semiconductor region in the vertical diode 51 from a sum of the doping doses of the two subregions 171a, 171b.

The same relations like in the vertical diode 51 apply for the ratios of the doping dose of the n-doped zone 173 to the doping dose of the n⁻-doped semiconductor region 171 and for the dimensions of the first subregion 171a, the second subregion 171b and the n-doped zone 173.

In the vertical diodes 11, 51, 101 according to the above embodiments, the p-doped semiconductor region 21 may alternatively be formed as an n-doped semiconductor region, the n⁻-doped semiconductor region 23 may be formed as a lightly p-doped or p-doped semiconductor region, the n⁺-doped semiconductor region 25 as a heavily p-doped or p⁺-doped semiconductor region, and the n-doped zone 27 as a p-doped zone. In this case, the field stop zone would also have a p-doping.

Furthermore, in the vertical IGBT 201 according to the above embodiment, the n-doped source region 165 may alternatively be formed as a p-doped source region, the p-doped body region 167 as an n-doped body region, the n⁻-doped semiconductor region 171 as a lightly p-doped or p⁻doped semiconductor region 169, and the n-doped zone 173 as a p-doped zone. The field stop zone 203 here would have a p-doping.

In the vertical semiconductor devices according to the above embodiments of the present invention, a number of the n-doped zones 27, 53, 173 is in a range from 1 to 2. However, any numbers of these n-doped zones are alternatives, the number of these n-doped zones preferably being in a range from 1 to 10 or alternatively from 3 to 10.

In the vertical semiconductor devices according to the above embodiments of the present invention, only one field stop zone is arranged in the n⁻-doped semiconductor region 23, 171. However, alternatively any number of field stop zones may be formed in the n⁻-doped semiconductor region 23, 171.

In the vertical IGBT 201 and the vertical diodes 11, 51, 101 according to an embodiment of the present invention, a ratio of a thickness or width of the n⁻-doped semiconductor region 23, 171 to a thickness or width of the n-doped zone 27, 173 each along a direction from the anode contact 17 or the first IGBT contact 157 to the cathode contact 19 or the second IGBT contact 159 is in a range from 20 to 500, however, any ratios of the thickness of the n⁻-doped semiconductor region 23, 171 to the thickness of the n-doped zone 27, 173 being alternatives.

In the above embodiments of the present invention, a ratio of a maximum doping density of the n-doped zone 27, 173 to a doping density of the n⁻-doped semiconductor region 23, 171 preferably is in a range from $10^2$ to $10^5$, however, any ratios of the doping densities being alternatives, as long as the doping density of the n-doped zone is higher than the doping density or basic doping density of the n⁻-doped semiconductor region and the doping density of a field stop zone which might be present.

In the vertical semiconductor devices according to the above embodiments of the present invention, a doping density of the n-doped zone is in a range from $10^{16}$ cm⁻³ to $10^{19}$ cm⁻³. However, any doping densities of the n-doped zone 27, 173 are alternatives, as long as the doping density of the n-doped zone 27, 173 is higher than the doping density of the lightly n-doped semiconductor region 23, 171 and the doping density of a field stop zone which may be present.

In the vertical semiconductor devices according to the above embodiments, a course of a doping profile along a path in the n-doped zones away from the doping maximum towards the first contact 17, 157 preferably is steeper than that from the doping maximum towards the second contact 19, 159, however, any course of the doping profile in the n-doped zones 27, 173 being alternatives.

In the vertical semiconductor devices according to an embodiment of the present invention, the n-doped zone 27, 173 and/or the further n-doped zone 53 have preferably been produced by means of proton irradiation. A depth or arrangement of the n-doped zone 27, 53, 173 relative to the n⁻-doped semiconductor region 23, 171 here may exemplarily be set via an irradiation energy. A doping density or doping quantity of the n-doped zone 27, 53, 171 may here be set via an irradiation dose, whereas desired tails of the doping profile or a course of the doping profile might be set via a temperature or a duration of an annealing process performed after irradiation. The temperature set during the annealing process or the annealing temperature here preferably is in a range from 350° C. to 500° C., whereas a duration of the annealing process or the annealing time preferably is in a range from 30 minutes to four hours.

As an alternative to proton irradiation, the n-doped zones and/or the buried n-doped zones may also be produced by means of phosphorous implantation in combination with an annealing step, however, relatively high implantation energies are required for this. Using epitaxy processes or applying a wafer bonding method are also possible. However, any manufacturing methods for producing the buried n-doped zones and/or the n-doped zones 27, 53, 173 are conceivable.

The vertical semiconductor devices 11, 51, 101, 201 are preferably designed as a power semiconductor device and are usually operated in a typical operating range of a potential difference between the first contact 17, 157 and the second contact 19, 159 in a range from 100 V to 10000 V, any operating ranges or fields of usage, however, with any potential differences between the first contact and the second contact being alternatives.

In the IGBT according to the above embodiment of the present invention, the setup of the IGBT is preferably made such that a lateral current flow between the source region and the n⁻-doped semiconductor region can be set by a potential at the gate electrode.

However, alternatively, the IGBTs may also be setup such that the gate electrode, the p-doped body region and the n⁻-doped semiconductor region are arranged such that the current flow through the body region is not in a lateral but, for example, in a vertical direction.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A vertical semiconductor device, comprising:
a semiconductor body;
a first contact on a first side of the semiconductor body;
a second contact on a second side of the semiconductor body opposite the first side;
wherein a plurality of regions are formed in the semiconductor body, the plurality of regions including, in a direction from the first contact to the second contact,
a first semiconductor region of a first conductivity type;
a second semiconductor region of a second conductivity type; and
a third semiconductor region of the second conductivity type;
wherein a basic doping density of the second semiconductor region is lower than a doping density of the third semiconductor region and the third semiconductor region is connected to the second contact in an electrically conductive manner;
wherein in the second semiconductor region a semiconductor zone of the second conductivity type is arranged, wherein the doping density in the semiconductor zone is increased relative to the basic doping density of the second semiconductor region, wherein the semiconductor zone separates a first part of the second semiconductor region of the basic doping density arranged closer to the first semiconductor region from a second part of the second semiconductor region of the basic doping density arranged closer to the third semiconductor region; and
wherein a maximum value of the doping density in the semiconductor zone is in a range of greater than $10^{16}$ cm⁻³ and a thickness of the semiconductor zone along the direction from the first contact to the second contact is in a range of smaller than 3 μm,
wherein the semiconductor zone is arranged near the third semiconductor region such that a ratio of a width of the second part of the second semiconductor region along the direction from the first contact to the second contact to a sum of a width of the first part of the second semiconductor region along the direction from the first contact to the second contact, a width of the second part and a thickness of the semiconductor zone is in a range from 0.01 to 0.2.

2. The vertical semiconductor device according to claim 1, wherein the semiconductor zone is arranged near the third semiconductor region such that the ratio of a width of the second part of the second semiconductor region along the direction from the first contact to the second contact to the sum of the width of the first part of the second semiconductor region along the direction from the first contact to the second contact, the width of the second part and the thickness of the semiconductor zone is in a range from 0.02 to 0.2.

3. The vertical semiconductor device according to claim 1, wherein the vertical semiconductor device forms a diode between the first contact and the second contact.

4. The vertical semiconductor device according to claim 1, wherein the first semiconductor region forms a well of the first conductivity type in which an additional semiconductor region of the second conductivity type is formed at least partly, wherein the additional semiconductor region is connected to the first contact in an electrically conductive manner so that the well and the semiconductor region abut on the first side of the semiconductor body, wherein an electrode is arranged in a manner spaced apart from a part of the well abutting on the first side of the semiconductor body to control a lateral current flow from the semiconductor region of the second conductivity type to the second semiconductor region.

5. The vertical semiconductor device according to claim 4, wherein the vertical semiconductor device is formed as an MOSFET.

6. A vertical semiconductor device comprising:
a semiconductor body;
a first contact on a first side of the semiconductor body;
a second contact on a second side of the semiconductor body opposite the first side;
wherein a plurality of regions are formed in the semiconductor body, the plurality of regions including, in a direction from the first contact to the second contact,
a first semiconductor region of a first conductivity type;
a second semiconductor region of a second conductivity type; and
a third semiconductor region of the first conductivity type, wherein the third semiconductor region is connected to the second contact in an electrically conductive manner;
wherein in the second semiconductor region a semiconductor zone of the second conductivity type is arranged, wherein the doping density in the semiconductor zone is increased relative to a basic doping density of the second semiconductor region, wherein the semiconductor zone separates a first part of the second semiconductor region of the basic doping density arranged closer to the first semiconductor region from a second part of the second semiconductor region of the basic doping density arranged closer to the third semiconductor region; and
wherein a maximum value of the doping density in the semiconductor zone is in a range of greater than $10^{16}$ $cm^{-3}$ and a thickness of the semiconductor zone along the direction from the first contact to the second contact is in a range of smaller than 3 μm, wherein the semiconductor zone is arranged near the third semiconductor region such that a ratio of a width of the second part of the second semiconductor region along the direction from the first contact to the second contact to a sum of a width of the first part of the second semiconductor region along the direction from the first contact to the second contact, a width of the second part and a thickness of the semiconductor zone is in a range from 0.01 to 0.2.

7. The vertical semiconductor device according to claim 6, wherein the semiconductor zone is arranged near the third semiconductor region such that the ratio of the width of the second part of the second semiconductor region along the direction from the first contact to the second contact to the sum of the width of the first part of the second semiconductor region along the direction from the first contact to the second contact, the width of the second part and the thickness of the semiconductor zone is in a range from 0.02 to 0.1.

8. The vertical semiconductor device according to claim 7, wherein the vertical semiconductor device is formed as an IGBT in which the first semiconductor region forms a well of the first conductivity type in which an additional semiconductor region of the second conductivity type is formed at least partly, the additional semiconductor region connected to the first contact in an electrically conductive manner so that the well and the additional semiconductor region abut on the first side of the semiconductor body, wherein an electrode is arranged in a manner spaced apart from a part of the well abutting on the first side of the semiconductor body to control a lateral current flow from the semiconductor region of the second conductivity type to the second semiconductor region.

9. The vertical semiconductor device according to claim 6, wherein a further semiconductor zone of the second conductivity type is arranged in the first part of the second semiconductor region, wherein the doping density of the further semiconductor zone is increased relative to the basic doping density of the second semiconductor region such that it separates a first subpart of the first part of the second semiconductor region of the basic doping density arranged closer to the first semiconductor region from a second subpart of the first part of the second semiconductor region of the basic doping density arranged closer to the third semiconductor region, wherein a maximum value of the doping density in the further semiconductor zone is in a range of greater than $10^{16}$ $cm^{-3}$ and a thickness of the further semiconductor zone along the direction from the first contact to the second contact is in a range of smaller than 3 μm.

10. The vertical semiconductor device according to claim 9, wherein a distance between the semiconductor zone and the further semiconductor zone is in a range from 1 μm to 5 μm.

11. The vertical semiconductor device according to claim 9, wherein a maximum value of the doping density of the further semiconductor zone substantially equals a maximum value of the doping density of the semiconductor zone.

12. The vertical semiconductor device according to claim 9, wherein a plurality of further semiconductor zones of the second conductivity type comprise the further semiconductor zone, wherein a number of the further semiconductor zones is in a range from 2 to 9, wherein the further semiconductor zones are arranged in the first part of the second semiconductor region and each of the further semiconductor zones comprise a doping density which is increased relative to the basic doping density and are arranged such that they divide-up the first part of the second semiconductor region in the direction from the first contact to the second contact into at least thee subparts, including the first and the second subparts, wherein each of the further semiconductor zones separates the second subpart of the first part of the second semiconductor region of the basic doping density arranged closer to the first semiconductor region from a subpart of the first part of the second semiconductor region of the basic doping density arranged closer to the third semiconductor region, wherein a maximum value of the doping density in the semiconductor zones is in a range of greater than $10^{16}$ $cm^{-3}$ and a thickness of the further semiconductor zones along the direction from the first contact to the second contact and the thickness of the semiconductor zone each is in a range of smaller than 3 μm.

13. The vertical semiconductor device according to claim 12, wherein the semiconductor zones from the number of semiconductor zones are each spaced apart from one another.

14. The vertical semiconductor device according to claim 12, wherein a maximum doping density comprises substantially the same value in each of the numbers of semiconductor zones.

15. The vertical semiconductor device according to claim 6, wherein the semiconductor zone in the direction from the first contact to the second contact comprises a thickness in a range from 0.1 μm to 3 μm.

16. The vertical semiconductor device according to claim 6, wherein the semiconductor zone in the direction from the first contact to the second contact comprises a thickness in a range from 0.1 μm to 1 μm.

17. The vertical semiconductor device according to claim 6, wherein the maximum value of the doping density of the semiconductor zone is in a range from $10^{16}$ $cm^{-3}$ to $10^{18}$ $cm^{-3}$.

18. The vertical semiconductor device according to claim 6, wherein the maximum value of the doping density of the semiconductor zone is in a range from $10^{17}$ cm$^{-3}$ to $10^{18}$ cm$^{-3}$.

19. The vertical semiconductor device according to claim 6, wherein the thickness of the semiconductor zone along the direction from the first contact to the second contact is smaller than 1 μm.

20. The vertical semiconductor device according to claim 6, wherein a ratio of the thickness of the semiconductor zone to a sum of the width of the first part of the second semiconductor region along the direction from the first contact to the second contact, a width of the second part and a thickness of the semiconductor zone is in a range from 0.02 to 0.2.

21. The vertical semiconductor device according to claim 1, wherein the thickness of the semiconductor zone along the direction from the first contact to the second contact is smaller than 1 μm.

22. The vertical semiconductor device according to claim 1, wherein a ratio of the thickness of the semiconductor zone to a sum of the width of the first part of the second semiconductor region along the direction from the first contact to the second contact, a width of the second part and a thickness of the semiconductor zone is in a range 0.02 to 0.2.

23. A vertical semiconductor device, comprising:
- a semiconductor body;
- a first contact on a first side of the semiconductor body;
- a second contact on a second side of the semiconductor body opposite the first side;
- wherein a plurality of regions are formed in the semiconductor body, the plurality of regions including, in a direction from the first contact to the second contact,
- a first semiconductor region of a first conductivity type;
- a second semiconductor region of a second conductivity type; and
- a third semiconductor region of the second conductivity type;

wherein a basic doping density of the second semiconductor region is lower than a doping density of the third semiconductor region and the third semiconductor region is connected to the second contact in an electrically conductive manner;

wherein in the second semiconductor region a semiconductor zone of the second conductivity type is arranged, wherein the doping density in the semiconductor zone is increased relative to the basic doping density of the second semiconductor region, wherein the semiconductor zone separates a first part of the second semiconductor region of the basic doping density arranged closer to the first semiconductor region from a second part of the second semiconductor region of the basic doping density arranged closer to the third semiconductor region; and wherein a maximum value of the doping density in the semiconductor zone is in a range of greater than $10^{16}$ cm$^{-3}$ and a thickness of the semiconductor zone along the direction from the first contact to the second contact is in a range of smaller than 3 μm, wherein a further semiconductor zone of the second conductivity type is arranged in the first part of the second semiconductor region, wherein the doping density of the further semiconductor zone is increased relative to the basic doping density of the second semiconductor region such that it separates a first subpart of the first part of the second semiconductor region of the basic doping density arranged closer to the first semiconductor region from a second subpart of the first part of the second semiconductor region of the basic doping density arranged closer to the third semiconductor region, wherein a maximum value of the doping density in the further semiconductor zone is in a range of greater than $10^{16}$ cm$^{-3}$ and a thickness of the further semiconductor zone along the direction from the first contact to the second contact is in a range of smaller than 3 μm.

* * * * *